(12) United States Patent
Neve de Mevergnies et al.

(10) Patent No.: US 7,633,168 B2
(45) Date of Patent: Dec. 15, 2009

(54) METHOD, SYSTEM, AND APPARATUS FOR A SECURE BUS ON A PRINTED CIRCUIT BOARD

(75) Inventors: Michael Neve de Mevergnies, Beaverton, OR (US); Jean-Pierre Seifert, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 11/476,956

(22) Filed: Jun. 28, 2006

(65) Prior Publication Data

US 2008/0001307 A1    Jan. 3, 2008

(51) Int. Cl.
*H01L 23/48* (2006.01)
*H01L 23/52* (2006.01)

(52) U.S. Cl. .............. 257/777; 257/778; 257/784; 257/737; 257/E23.178

(58) Field of Classification Search ............ 257/777, 257/778, 723, 784, E23.169, E23.178
See application file for complete search history.

(56) References Cited

U.S. PATENT DOCUMENTS

| | | | | |
|---|---|---|---|---|
| 5,477,082 A * | 12/1995 | Buckley et al. | ............ | 257/679 |
| 5,646,828 A * | 7/1997 | Degani et al. | ............... | 361/715 |
| 5,896,894 A * | 4/1999 | Schwamborn et al. | ....... | 138/110 |
| 6,147,401 A * | 11/2000 | Solberg | ...................... | 257/723 |
| 6,404,044 B2 * | 6/2002 | Akram et al. | ............... | 257/686 |
| 6,664,643 B2 * | 12/2003 | Emoto | ......................... | 257/777 |
| 6,847,105 B2 * | 1/2005 | Koopmans | ................... | 257/686 |
| 6,853,064 B2 * | 2/2005 | Bolken et al. | ............... | 257/686 |
| 6,936,918 B2 * | 8/2005 | Harney et al. | ............... | 257/704 |
| 6,979,895 B2 * | 12/2005 | Akram et al. | ............... | 257/686 |
| 7,109,576 B2 * | 9/2006 | Bolken et al. | ............... | 257/686 |
| 7,217,993 B2 * | 5/2007 | Nishimura | ................... | 257/686 |
| 2004/0238934 A1 * | 12/2004 | Warner et al. | ............... | 257/686 |
| 2006/0043559 A1 * | 3/2006 | Chow et al. | ................. | 257/686 |

* cited by examiner

*Primary Examiner*—Nitin Parekh
(74) *Attorney, Agent, or Firm*—Buckley, Maschoff & Talwalkar LLC

(57) ABSTRACT

A method, apparatus, and system, the apparatus including, in some embodiments, a printed circuit board (PCB), an integrated circuit (IC) positioned over and electrically connected to the PCB, a chip positioned between the PCB and the IC, and a closed boundary barrier between and contacting the PCB and the IC to define an inner containment area that completely contains the chip within the inner containment area.

12 Claims, 3 Drawing Sheets

300

```
┌─────────────────────────────────────────┐
│      POSITION A CHIP ON A PCB           │
│                                    305  │
└─────────────────────────────────────────┘
                    │
                    ▼
┌─────────────────────────────────────────┐
│  ELECTRICALLY CONNECT THE CHIP TO THE PCB│
│                                    310  │
└─────────────────────────────────────────┘
                    │
                    ▼
┌─────────────────────────────────────────┐
│   POSITION AN IC OVER THE PCB AND THE CHIP│
│                                    315  │
└─────────────────────────────────────────┘
                    │
                    ▼
┌─────────────────────────────────────────┐
│   FORM A BOUNDARY BARRIER ON THE PCB    │
│      BETWEEN THE IC AND THE PCB TO      │
│  DEFINE AN INNER CONFINEMENT AREA WITHIN│
│  WHICH THE CHIP AND ELECTRICAL CONNECTIONS│
│    THERETO ARE COMPLETELY CONTAINED     │
│                                    320  │
└─────────────────────────────────────────┘
```

METHOD, SYSTEM, AND APPARATUS FOR A SECURE BUS ON A PRINTED CIRCUIT BOARD

BACKGROUND

Maintaining and protecting the security of a device or system may have a number of benefits. For example, a secure device, operating system, application, and system may be configured to prevent the unauthorized or undesired appropriation (e.g., "hacking") of data about or from the device, operating system, application, and system. Some systems and devices may include one or more security features and applications. Security features and applications may include encryption and password protecting data.

Some security applications may access a memory. Some security applications may provide communication to and from the application via a data bus or other access point. Generally, from some security perspectives, access to a communication bus and/or a memory to store security data may provide an opportunity to breach the security of a system and device.

BRIEF DESCRIPTION OF THE DRAWINGS

FIG. 3 is an exemplary flow chart of a process, in accordance with some embodiments herein.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
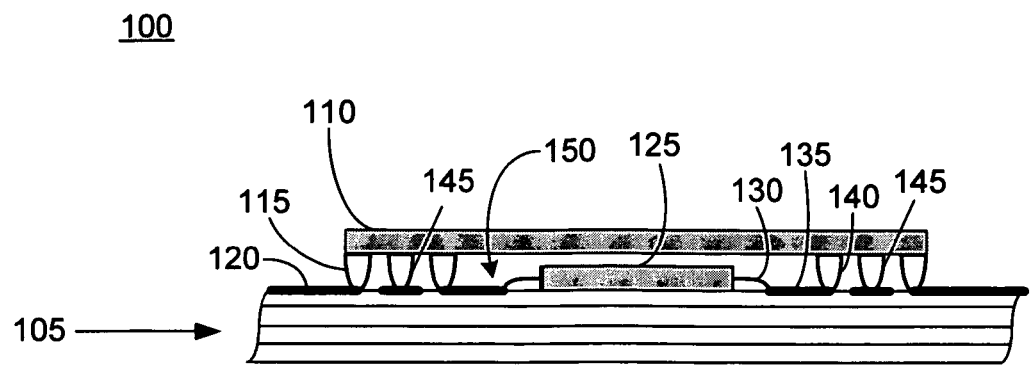
FIG. 1 is an exemplary illustration of a side elevation view of an apparatus, in accordance with some embodiments herein.
Figure 2:
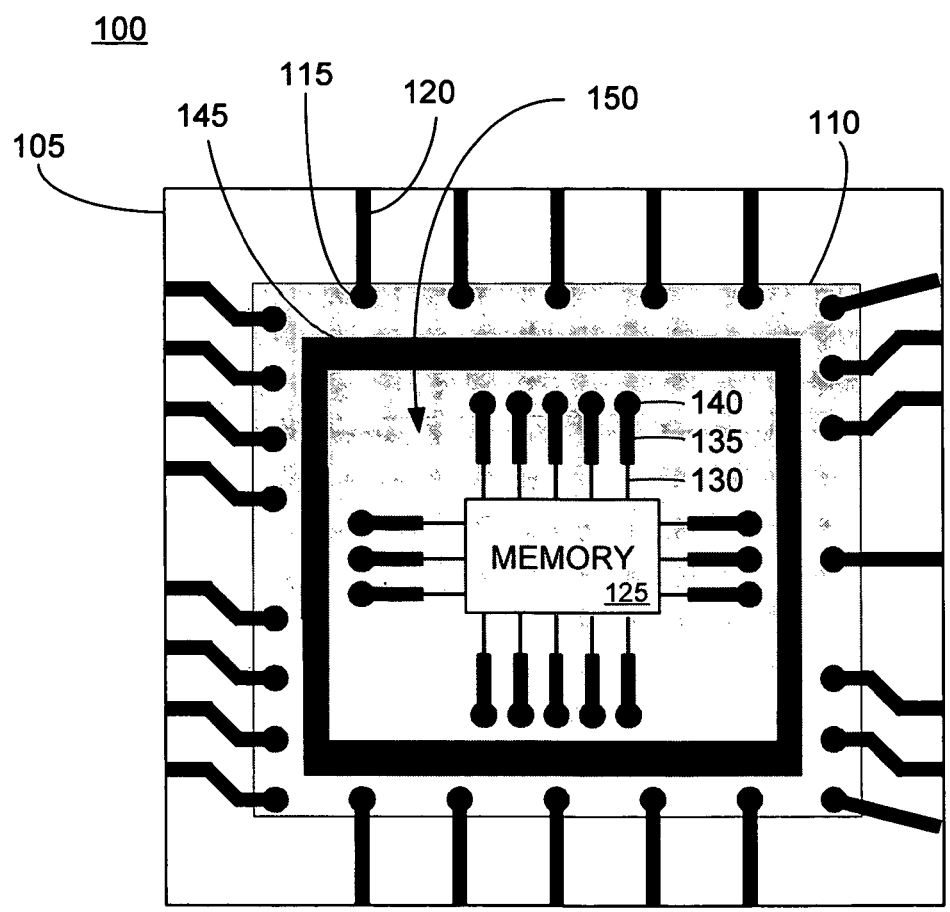
FIG. 2 is an exemplary illustration of a top view of an apparatus, in accordance with some embodiments herein.

FIG. 1 is an exemplary side elevation view of an apparatus in accordance with some embodiments herein, generally referenced by numeral 100. FIG. 2 provides a top plan view of apparatus 100. FIGS. 1 and 2 may both be referenced for an understanding of apparatus 100 in connection with the disclosure the several embodiments herein.

Apparatus 100 includes a printed circuit board (PCB) 105, an integrated circuit (IC) 110 positioned over PCB 105 and electrically connected to PCB 105, and an IC chip 125 positioned between PCB 105 and IC 110. In some embodiments, PCB 105 and IC 110 are arranged in a spaced apart configuration. Apparatus 100 may include a closed boundary barrier 145 between and in contact with PCB 105 and IC 110.

PCB 105 may include one or more levels. The one or more layers may include laminated conductive layers separated and supported by layers of insulating substrates. In some embodiments, the various layers may be connected by vias extending between the various layers.

In some embodiments herein, chip 125 is electrically connected to PCB 110 by one or more pads 130. A PCB pad 135 may provide an electrically conductive connection point to facilitate connecting chip 125 to PCB 105. Chip 125, pads 130, and PCB pads 135 may be contained or otherwise located within an inner confinement area 150 defined by boundary barrier 145. In some embodiments, boundary barrier 145 provides a continuous structure between PCB 105 and IC 110 that separates inner confinement area 150 including chip 125, pads 130, and PCB pads 135 from being accessed from a point exterior to the inner confinement area.

In some embodiments, chip 125, pads 130, and PCB pads 135 are completely surrounded and physically shielded from direct physical contact (e.g., undesired eavesdropping, probing, etc.) by boundary barrier 145. For example, IC 110 may be located over a top of chip 125, PCB 105 may be located below a bottom of chip 125, and boundary barrier 145 may be located outward of lateral sides of chip 125, pads 130, and PCB pads 135. In some embodiments where boundary barrier 145 is between and in contact with PCB 105 and IC 110, the PCB, IC, and boundary barrier may cooperate to physically shield and deny physical access to chip 125, pads 130, and PCB pads 135.

Boundary barrier 145 may be a conductive material. In some embodiments, boundary barrier 145 may include a solder material. In some embodiments, boundary barrier 145 may provide a conductive pathway between PCB 105 and IC 110.

In some embodiments, PCB pads 135 may include a conductive signal trace on a surface of PCB 105, a wire, a data bus, and other electrical conductive connectors. PCB pads 135 may be any number, combination, and variety of communication pathways between PCB 105 and IC 110.

In some embodiments, PCB pads 135 (e.g., a data bus) are located entirely within inner confinement area 150. The data bus located in the inner confinement area 150 is physically shielded from the environment outside of the inner confinement area. Accordingly, a communication session between PCB 105, chip 125, and IC 110 may be conducted in an efficient and secure manner.

In some embodiments in accordance herewith, communication between chip 125 and IC 110 may be provided over a communication pathway (e.g., data bus, conductor, trace, etc.) that is physically isolated and, in some aspects, secure. Accordingly, some considerations for encrypting data over a data bus may be lessened or obviated.

In some embodiments, IC 125 may include a security IC. The security IC may have one or more security features incorporated therein. The security IC may include one or more encryption features to encrypt or otherwise enable secure handling of data and information processed by IC 110. For example, the security chip may include instructions and mechanisms for executing cryptographic operations, sensors, etc. In some embodiments, IC 125 may tend to be larger than chip 125, due at least in part to the inclusion of encryption features in the security IC In some embodiments, boundary barrier 145 may include, incorporate, and/or be associated with one or more integrity mechanisms. The integrity mechanisms (not shown) may provide an indication of a breach, a break, a discontinuity, or another type of compromise and/or degradation of the structural integrity of boundary barrier 145. The integrity mechanisms may include a detector that senses a breach based on a resistive or a capacitive testing process and other types of sensors.

In some embodiments, IC 110 is connected to PCB pad 135 by an inner connector 140. Inner connector 140 may be a conductive pathway, such as, for example, a solder material.

In some embodiments, IC 110 is connected to a PCB conductive trace 120 by an outer connector 115. Outer connector 115 may be a conductive pathway, such as, for example, a solder material. Outer connection 115 may provide a further physical barrier to block physical access to chip 125 and electrical connections to chip 125.

Shown is an embodiment where PCB conductive trace 120 and outer connector 115 are outside of the inner confinement area 150. Accordingly, communication sessions conducted using the PCB conductive trace and the outer connector may be accessible (e.g., not protected or secure).

FIG. 3 is an exemplary flow diagram of a process 300, in accordance with some embodiments herein. Process 300 and aspects thereof may used in a manufacturing flow to produce a system and apparatus in accordance with a number of embodiments disclosed herein. Process will be disclosed in a context of the apparatus depicted in FIGS. 1 and 2. Process 300 may be applicable to apparatuses other than or in addition to those shown in FIGS. 1 and 2.

At operation 300, chip 125 is placed on PCB 105. In some embodiments, the chip may include a memory module. In some embodiments, the chip may be prepared for mounting on PCB 105 prior to positioning operation 300. For example, chip 125 may undergo a thinning process during the manufacture thereof to prepare it for use in process 300.

At operation 310, chip 125 is electrically connected to PCB 105. Chip 125 may be attached to PCB 105 in accordance with a PCB manufacturing process, including, for example, by a trace, a wire, PCB pad 135, a bump, a data bus, and combinations thereof. The electrical connections may provide a communication pathway to the chip.

At operation 315, IC 110 is positioned over PCB 110, chip 125, and the electrical connections to the chip (e.g., 130, 135).

At operation 320, boundary barrier 145 is formed on PCB 105 to completely surround chip 125 and electrical connections 130, 135 to the chip. Boundary barrier 145 is arranged between IC 110 and PCB 105 at locations beyond a lateral extent of the chip and the electrical connections to the chip, as illustrated in FIGS. 1 and 2. Boundary barrier 145, in conjunction with chip 125 and IC 110 extending over chip 125, cooperate to define the inner containment area 150 within which the chip and the electrical connections thereto are contained. Boundary barrier 145 may extend from PCB 105 to IC 110 in a region between the PCB and the IC.

In some embodiments, boundary barrier 145 includes a solder material that may be subjected to a thermal reflow process to attach the boundary barrier to PCB 105. During the reflow process, boundary barrier 145 may be heated to a temperature sufficient to cause the solder of the boundary barrier to flow, thereby facilitating an attachment of the IC to the PCB.

It is noted that the various operations of process 300 may be accomplished in conjunction or in association with other processes and in sequences other than that specifically delineated in FIG. 3. For example, operation 315 may occur before, after, or at least partially in parallel with operation 320.

Figure 4:
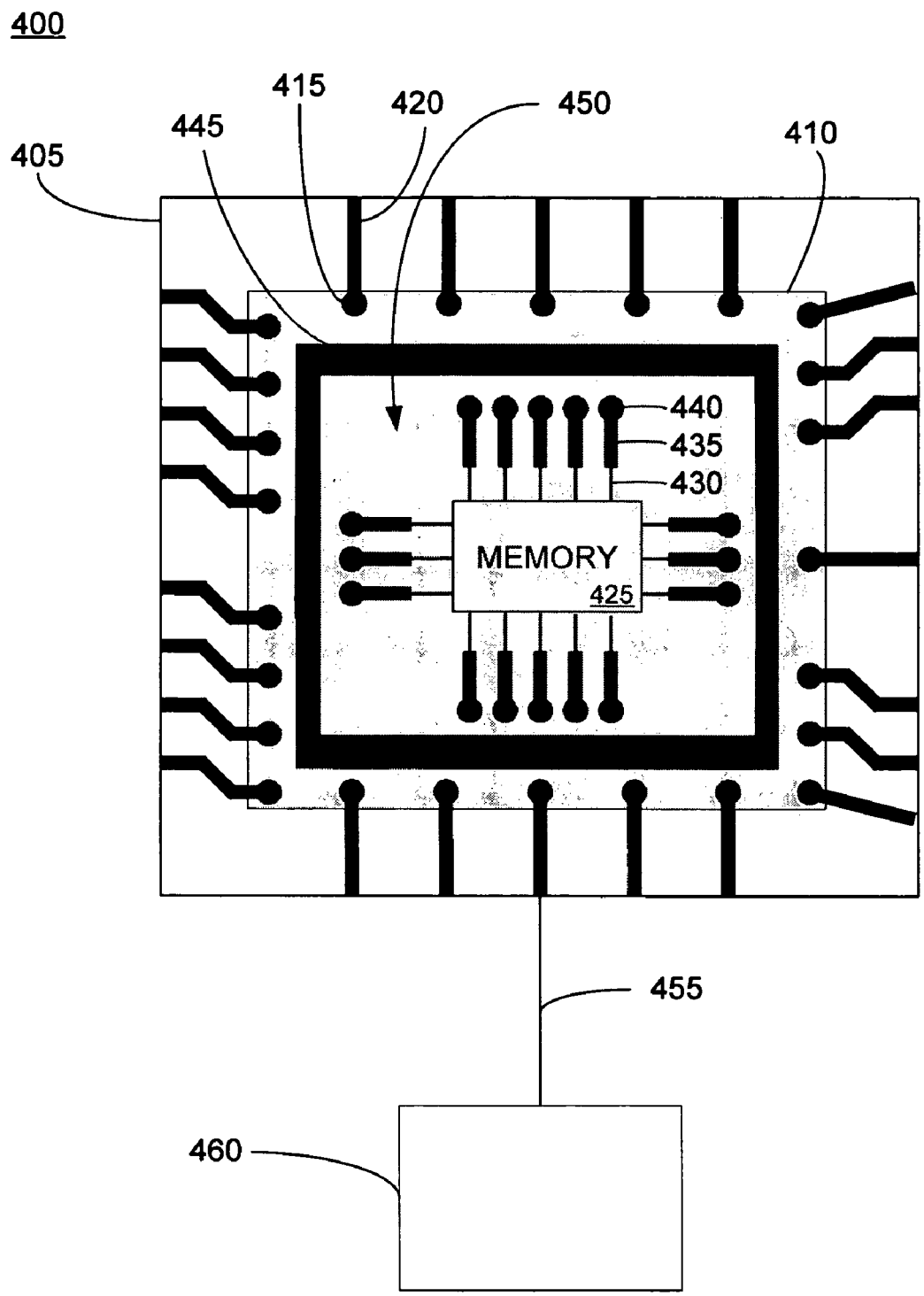
FIG. 4 is an exemplary illustration of a system, in accordance with some embodiments herein.

FIG. 4 is an exemplary depiction of a system 400 including an apparatus, for example a PCB 405 having a memory chip 425 attached to the PCB by a combination of electrical connections, including pads 430, PCB pads 435, and inner connections 440. Memory chip 425 and the electrical connections thereto are contained within an inner confinement area 450 that is defined by a boundary barrier 445. An IC 410 is positioned over memory chip 425 and the electrical connections to the memory chip. Memory chip 425 and the electrical connections thereto are completely contained within inner confinement area 450. An outer connection 415 provides a conductive pathway to trace 420 from PCB 405. A device 460 is connected to PCB 405 by connector (e.g., a wire).

Those in the art should appreciate that system 400 may include additional, fewer, or alternative components to PCB 405, memory chip 425, IC 410, and device 460.

In some embodiments, device 460 may include a subsystem such as, for example, a graphics subsystem, an audio processing subsystem, other specialized processing subsystems, a processor, and discrete components. In an instance device 460 is a memory device 460 may comprise any type of memory for storing data, including but not limited to a Single Data Rate Random Access Memory, a Double Data Rate Random Access Memory, or a Programmable Read Only Memory.

It should be appreciated that the drawings herein are illustrative of various aspects of the embodiments herein, not exhaustive of the present disclosure.

What is claimed is:

1. An apparatus comprising:
a printed circuit board (PCB);
an integrated circuit (IC) positioned over and electrically connected to the PCB;
a chip positioned between the PCB and the IC and in a spaced apart location from the IC; and
a closed boundary barrier between and contacting the PCB and the IC to define an inner containment area, wherein the closed boundary barrier is a closed, entirely continuous structure extending from and between the PCB and the IC, and the chip and all electrical connections to the chip are completely contained within the inner containment area.

2. The apparatus of claim 1, wherein the closed boundary barrier comprises a conductive material.

3. The apparatus of claim 1, wherein the closed boundary barrier includes an integrity detection mechanism to indicate a breach of the closed boundary barrier.

4. The apparatus of claim 1, wherein the PCB comprises a plurality of layers.

5. The apparatus of claim 1, wherein at least one of the electrical connections comprises a data bus.

6. The apparatus of claim 1, wherein the IC comprises a security IC having at least one security feature.

7. The apparatus of claim 1, wherein the closed boundary barrier includes a conductive solder.

8. The apparatus of claim 1, wherein the chip is a memory chip.

9. A system comprising:
a printed circuit board (PCB);
an integrated circuit (IC) positioned over and electrically connected to the PCB;
a chip position between the PCB and the IC and in a spaced apart location from the IC;
a closed boundary barrier between and contacting the PCB and the IC to define an inner containment area, wherein the closed boundary barrier is a closed, entirely continuous structure extending from and between the PCB and the IC, and the chip and all electrical connections to the chip are completely contained within the inner containment area; and
a memory module electrically connected to the PCB, wherein the memory is a Random Access Memory.

10. The system of claim 9, wherein the closed boundary barrier comprises a conductive solder.

11. The system of claim 9, wherein the closed boundary barrier includes an integrity detection mechanism to indicate a breach of the closed boundary barrier.

12. The system of claim 9, wherein at least one of the electrical connections comprises a data bus.

* * * * *